(12) United States Patent
Jahromi

(10) Patent No.: US 7,794,786 B2
(45) Date of Patent: *Sep. 14, 2010

(54) COMPOSITE MATERIAL AND PROCESS FOR PREPARING A COMPOSITE MATERIAL

(75) Inventor: Shahab Jahromi, Maastricht (NL)

(73) Assignee: DSM IP Assets B.V., Heerlen (NL)

( * ) Notice: Subject to any disclaimer, the term of this patent is extended or adjusted under 35 U.S.C. 154(b) by 971 days.

This patent is subject to a terminal disclaimer.

(21) Appl. No.: 10/556,076

(22) PCT Filed: May 10, 2004

(86) PCT No.: PCT/NL2004/000313

§ 371 (c)(1),
(2), (4) Date: Nov. 15, 2006

(87) PCT Pub. No.: WO2004/101662

PCT Pub. Date: Nov. 25, 2004

(65) Prior Publication Data

US 2007/0207319 A1  Sep. 6, 2007

(30) Foreign Application Priority Data

May 15, 2003  (WO) ............... PCT/NL03/00362

(51) Int. Cl.
*C23C 16/02* (2006.01)
*B32B 15/08* (2006.01)
*B32B 27/32* (2006.01)
*B32B 27/36* (2006.01)

(52) U.S. Cl. ............ 427/248.1; 427/255.6; 428/451; 428/523

(58) Field of Classification Search ........ 427/248.1, 427/255.6; 428/451, 523
See application file for complete search history.

(56) References Cited

U.S. PATENT DOCUMENTS

| 4,268,541 A | 5/1981 | Ikeda et al. ............... 427/177 |
| 4,837,114 A | 6/1989 | Hamada et al. ............ 427/527 |
| 5,770,301 A * | 6/1998 | Murai et al. ............... 428/213 |
| 6,632,519 B1 * | 10/2003 | Jahromi et al. ............. 428/335 |

FOREIGN PATENT DOCUMENTS

| EP | 1088114 B1 | 8/2003 |
| JP | 11-140626 | 5/1999 |
| WO | WO 99/66097 | 12/1999 |

OTHER PUBLICATIONS

Machine Translation of JP11140626 (1999).

* cited by examiner

*Primary Examiner*—D. S Nakarani
(74) *Attorney, Agent, or Firm*—Nixon & Vanderhye P.C.

(57) ABSTRACT

The invention relates to a process for the preparation of a composite material, said composite material comprising a substrate and a layer on the substrate, comprising a vapor-depositing step in which a compound comprising a triazine compound is deposited on the substrate at a pressure below 1000 Pa, whereby the layer is formed, wherein during the vapor-depositing step the temperature of the substrate lies between −15 °C. and +125 °C. The invention further relates to a composite material, obtainable by the process as disclosed.

20 Claims, No Drawings

COMPOSITE MATERIAL AND PROCESS FOR PREPARING A COMPOSITE MATERIAL

This application is the US national phase of international application PCT/NL2004/000313 filed 10 May 2004 which designated the U.S. and claims benefit of PCT/NL03/000362, dated 15 May 2003, the entire content of which is hereby incorporated by reference.

The invention relates to a process for the preparation of a composite material, said composite material comprising a substrate and a layer on the substrate, said process comprising a vapour-depositing step in which a compound comprising a triazine compound is deposited on the substrate at a pressure below 1000 Pa, whereby the layer is formed.

Such a process is known from WO 99/66097. In WO 99/66097, the triazine-comprising layer acts primarily as barrier layer, to reduce for example the oxygen transmission rate (OTR) of the substrate. WO 99/66097 mentions various suitable triazine compounds, such as melamine.

A drawback of the known process is that the barrier properties are not always sufficient.

It is the goal of the present invention to reduce the above-mentioned drawback.

The goal of the present invention is achieved in that during the vapour-depositing step the temperature of the substrate lies between −15° C. and +125° C.

The advantage of the present invention is that a composite material with improved properties, in particular relating to barrier properties, is obtained. It is surprising that the selection of a relatively high temperature of the substrate leads to a composite material with improved barrier properties, whereas typically in industry substrate temperatures are −20° C. or lower.

The composite material as prepared in the process according to the invention comprises a substrate. The substrate is the material that serves as carrier of the layer; it is the object on which the layer is applied. The substrate may consist essentially of a homogeneous material, or it may itself be non-homogeneous or a composite material. The substrate may comprise various layers. The substrate may be essentially flat, or it may have a complex three-dimensional shape. Examples of suitable substrates are flexible packagings such as films, tools, rigid packagings such as bottles or pre-shaped packaging boxes. Preferably, the substrate comprises a polymeric material, paper, cardboard, metal, a metallic compound, a metal oxide, ceramic, or combinations thereof. Examples of polymeric compounds are thermoplastic compounds and thermosetting compounds. Examples of thermoplastic compounds are polyethlylene (PE), polyproplylene (PP), and polyethylene terephtalate (PET). These thermoplastic compounds are often used in the form of a film, either as such or oriented; such orientation may be biaxial, such as for example biaxially oriented polypropylene film (BOPP). Preferably, the substrate is itself a composite material comprising a vapour-deposited layer comprising aluminium, aluminium oxide, aluminium and aluminium oxide, or silicon oxide whereby the layer according to the invention is applied on top of the aluminium- or silicon-containing layer.

The composite material according to the invention comprises a layer on the substrate. The layer is applied to the substrate by means of a vapour-depositing step. Vapour-depositing is, as such, known. As is known, a vapour-depositing step is often carried out at a reduced pressure, i.e. a pressure below atmospheric. In the process according to the invention, the pressure lies below 1000 Pa. In the vapour-depositing step, a compound is deposited on the substrate, thereby forming the layer. The said compound comprises according to the invention a triazine compound. In principle, any triazine compound may be chosen; preferably, the triazine compound comprises melamine, melam, melem, melon, melamine functionalised with polymerisable groups, melamine salts, or mixtures thereof. More preferably, the triazine compound comprises melamine; most preferably, the triazine compound consists essentially of melamine.

The thickness of the layer as formed on the substrate in the vapour-depositing step depends on its intended purpose, and can thus vary within wide limits. Preferably, the thickness of the layer is less than 100 µm, more preferably less than 10 µm, and even more preferably less than 1 µm; the minimum thickness is preferably at least 2 nm, more preferably at least 10 nm.

During the vapour-depositing step, the temperature of the substrate lies between −15° C. and +125° C. The temperature of the substrate is defined herein as the temperature of the part of the substrate that is not being vapour-deposited. For example, if the vapour-depositing step is done on a film which is guided over a temperature-controlled coating drum, the temperature of the substrate is the temperature at which the coating drum is controlled, thus the temperature of the surface section of the film that is in immediate contact with the coating drum. In such a case, and in view of the fact that the to be deposited compounds often have a much higher temperature than 125° C., it will typically occur—as is known—that the temperature of the side of the substrate that is being deposited is higher than the temperature of the side that is not being deposited.

It was found that as the temperature of the substrate rises to −15° C. and above, the barrier properties of the composite material improve compared to a vapour-depositing step where the temperature of the substrate is −20° C. or lower. On the other hand, in order to maintain an acceptable speed of depositing and in order to ensure that the substrate remains intact—i.e. not deform, melt or degrade—it will generally be necessary that the temperature of the substrate should remain below +125° C.—or as much below that as required by the specific properties of the substrate, while remaining above −15° C. Preferably, the temperature of the substrate lies, during the vapour-depositing step, at −5° C., 0° C. or +5° C. or above; more preferably, the said temperature lies at +10° C., +15° C. or +20° C. or above. It was found that as the temperature of the substrate rises further above −15° C., an even further increase of barrier properties was found. As indicated above, for reasons of substrate stability and/or economy of speed it can be useful or necessary to ensure that the temperature of the substrate during the vapour-depositing step remains at or below +125° C., preferably at or below +90° C., more preferably at or below +60° or +50° C., in particular at or below +40° C., and most preferably at +30° C. or below.

Methods to ensure that the substrate has a defined temperature are, as such, known. One such a known method of ensuring that the substrate has a defined temperature is applicable in case there is at least one section, plane or side of the substrate where no layer is to be vapour-deposited; the said section, plane or side can then be brought into contact with a cooled or heated surface to bring the temperature to a desired level and keep it there. As an example, it is known that in case the substrate is a film and the vapour-depositing step is executed as a semi-continuous of continuous process whereby the layer will be deposited on one side of the film, the said film can be guided over a temperature-controlled roll, also known as coating drum, in such a fashion that the other side of the film—where no layer will be deposited—is in contact with the temperature-controlled roll before and/or during and/or following the vapour-depositing step.

The vapour-depositing step according to the invention is carried out at a pressure at or below 1000 Pa. It is as such known that a vapour-depositing step can be carried out at sub-atmospheric pressures, such as at the said 1000 Pa or at lower pressures such as at 100 Pa or 10 Pa or lower. In the examples of WO 99/66097, the pressure was even reduced to between $5 \times 10^{-3}$ Pa and $1 \times 10^{-2}$ Pa. It was found, surprisingly, that the properties of the composite material, such as the barrier properties, can be even further improved by reducing the pressure at which the vapour-depositing step is carried out even further, preferably to $4 \times 10^{-3}$ Pa or below. More preferably, the vapour-depositing step is-carried out at a pressure of $2 \times 10^{-3}$ Pa or below or $1 \times 10^{-3}$ Pa or below; in particular, the vapour-depositing step is carried out at a pressure of $5 \times 10^{-4}$ Pa or below, or $1 \times 10^{-4}$ Pa or below; more in particular, the vapour-depositing step is carried out at a pressure of $5 \times 10^{-5}$ Pa or below, or $1 \times 10^{-5}$ Pa or below; most preferably, the vapour-depositing step is carried out at a pressure of $5 \times 10^{-6}$ Pa or even of $1 \times 10^{-6}$ Pa or below. At present, it is thought that pressures lower than $1 \times 10^{-10}$ Pa will not lead to a further increase the benefits as indicated.

In an alternative embodiment of the process according to the invention, the effect of the pressure reduction of the vapour-depositing step to $4 \times 10^{-3}$ Pa or below on the properties—like for example barrier properties—of the resulting composite material is such that this measure can partly or even wholly replace the beneficial effects of the measure of bringing the temperature of the substrate during the vapour-depositing step to between $-15°$ C. and $+125°$ C. In this alternative embodiment, it can thus be possible that the temperature of the substrate lies below $-15°$ C., at $-20°$ C., $-40°$ C. or even at $-60°$ C. or below.

The layer typically comprises grains containing the triazine compound. Grains, wherein the compound is present in crystalline and non-polymerised form and separated by boundaries, are, for crystallisable compounds in general, commonly known to persons skilled in the art. Optimal effect of the properties conferred by the layer, in particular relating to barrier properties, may be achieved if the layer essentially consists of grains containing the triazine compound. If the layer consists wholly or almost wholly of grains containing the triazine compound, it may be preferred that the whole of the layer essentially consists of the triazine compound.

The grains in the layer have a size, which is defined herein as the largest dimension, parallel to the surface of the substrate (i.e. as seen from top), within a grain. It was found that the average size of the triazine-containing grains in the second layer may be as important as, or may even be more important than the thickness of the second layer in determining important characteristics such as barrier properties. Without committing to any specific theoretical explanation, it is thought that optimal barrier properties are achieved by, contrary to what the skilled person might expect, focusing on the amount and size of the boundaries between the grains rather than focusing on the thickness of the deposited layer. It is thought that boundaries between grains are relative weak spots in conferring barrier properties to the composite material; thus, if the average grain size becomes too small, there are so many boundaries that barrier properties are negatively influenced. On the other hand, if the average grain size becomes too big, it is thought that the boundary areas themselves become bigger disproportionately, so that, again, barrier properties suffer. The average grain size is preferably at least 10 nm, more preferably at lease 50 nm, even more preferably at least 100 nm and most preferably at least 200 nm. The average grain size is preferably at most 2000 nm, more preferably at most 1000 nm, even more preferable at most 600 nm and most preferably at most 400 nm. Average size means, within the context of the present invention, the numbered average. In a preferred embodiment, the layer essentially consists of the triazine compound so that the triazine crystal structures within the grains are not significantly interrupted.

In the process according to the invention, the vapour-depositing step is preferably carried out in such a way that the average size of the triazine-containing grains lies between 10 nm and 2000 nm. It has been found that the average size of a vapour-deposited grain a.o. depends on the number of nucleation points on the surface on which the grain grows: the higher the number of nucleation points, the smaller the average grain size will be. The average size of the deposited grains can thus be varied by adjusting those process conditions during the vapour-depositing step that influence the number of nucleation points from which the grain grows. It has been found according to the invention that the number of nucleation points increases with increasing difference between the deposition temperature, i.e. the temperature to which the triazine-containing compound is heated, and the temperature of the substrate. Preferably, said temperature difference lies between $150°$ C. and $370°$ C., while respecting the temperature range of the substrate according to the invention. Also, it was found that the number of nucleation points decreases if the pressure is increased at which the vapour-depositing step is done. Preferably, the pressure in the vapour-depositing step lies between $10^{-6}$ Pa and $10^{-2}$ Pa. Furthermore, it should be noted that the nature of the substrate also has an influence on the number of nucleation points that are being formed. The person skilled in the art can thus, using the teachings regarding the parameters of temperature difference and pressure as given, determine via experimentation what the optimal process conditions for the vapour-depositing step are in order to achieve an average grain size within the preferred range as given above.

It can be beneficial to enhance the properties of the composite material as resulting from the process according to the invention even further by submitting the substrate to a further process step, prior or during the vapour-depositing step. It can also be beneficial o enhance the properties of the composite material as resulting from the process according to the invention even further by submitting the composite material to a further process step, during or subsequent to the vapour-depositing step. Examples of such further process steps are: a cross-linking step, in which the triazine compound in the layer reacts with itself or with another compound that was either co-applied in the layer or separately brought into contact with the layer; a plasma treatment; a corona treatment; application of UV radiation; application of electron-beam. Such a further process step may be beneficial in enhancing certain targeted properties of the layer such as adhesion, resistance to humidity or scratch resistance. The further process step may lead to a change in the grain size and/or structure of the layer.

Preferably, the substrate is, prior to or during the vapour-depositing step, treated with plasma, corona, UV radiation, electron beam, or a reactive gas. A reactive gas is a gas that is capable of reacting with the triazine compound and/or with the substrate. The said reaction may take place instantly, or may take place subsequently. The said reaction may take place either unaided, or with the help of an auxiliary measure such as a temperature'or radiation treatment. The reactive gas comprises preferably water and/or formaldehyde. In a preferred embodiment the substrate is a composite material comprising an aluminium-comprising layer—whereby the triazine-comprising layer will be deposited on top of the aluminium-comprising layer—and the reactive gas comprises water vapour. Due to chemical reaction of the water vapour with the aluminium, compounds are formed on the surface of the aluminium-comprising layer that enhance the adhesion of the triazine-comprising layer to the substrate.

Preferably, the composite material is, during the vapour-depositing step or subsequent to it, treated with plasma, corona, UV radiation, electron beam, or a reactive gas. The reactive gas comprises preferably water and/or formaldehyde.

In an embodiment of the process according to the invention, a second layer is added to the composite material, on top of the vapour-deposited layer that comprises the triazine compound (which will in this embodiment be referred to as the first layer). The second layer may be vapour-deposited on the first layer, but may also be applied in any other known fashion, such as via lamination. The second layer may comprise any compound, depending on the function and/or the desired properties of the composite material. Examples are: a thermoplastic or thermosetting polymeric compound, a triazine compound which may be the same compound as in the first layer or a different compound, a metallic compound such as aluminium, an oxide of a metal such as for example aluminium oxide. The second layer may itself be a composite material.

In view of the vapour-depositing technology, used to create the first layer, and in view of the characteristics of triazine compounds, it was found that the first layer can act as an interlayer. An interlayer herein means a layer that irons or smooths out at least part of any surface roughness as present on the surface of the substrate, so that the second layer is applied to a much smoother surface (i.e. less surface roughness); this has the advantage that the risk of damage to the second layer is reduced. It was found, furthermore, that when the smoothening function on the first layer is to be the primary function and when its function as barrier layer is less important, the temperature of the substrate during the vapour-depositing step may lie in a wider range than as given above, thus preferably between −60° C. and +125° C., more preferably between −30° C. and +50°C.

The present invention further relates to a composite material, obtainable by the process according to the invention as described above. The said composite material can be used in any number of applications, in particular applications where barrier properties such as a low OTR are required, such as for example in the packaging of oxygen-sensitive or perishable products such as foodstuffs.

The present invention will be illustrated by means of an Example and Comparative Experiment.

EXAMPLE I

A layer consisting of melamine was vapour-deposited on a substrate in the form of a film consisting of biaxially oriented polypropylene (BOPP). The vapour-depositing step was carried out at a pressure of 10 Pa, or about $1\times10^{-4}$ atmosphere. The temperature of the substrate was +20° C. The melamine was evaporated from a crucible; the melamine in the crucible was maintained at a temperature of 310° C. The melamine deposited on the substrate. The substrate was guided along the crucible with a speed of 7 meters per second; this is a very high speed, reflecting conditions as occurring in industrial practice. The resulting composite material had an oxygen transmission rate (OTR) of 47 $cm^3/m^2$.bar.day.

Comparative Experiment I

A composite material was prepared in the same fashion as in Example I, except that the temperature of the substrate was −20° C. instead of +20° C. The OTR was 120 $cm^3/m^2$.bar.day, reduced from 1600 as measured on the substrate (BOPP film) without any layer deposited on it.

It can be easily seen from the Example and the Comparative Experiment that although the known process already realises a favourable reduction of the OTR as compared to the untreated substrate, thereby increasing the barrier properties, the process according to the invention realises a further reduction of the OTR, i.e. a further enhancement of the barrier properties.

The invention claimed is:

1. Process for the preparation of a composite material comprised of a substrate and a layer on the substrate, wherein the substrate comprises a polymeric film and a vapour-deposited layer of aluminum, aluminum oxide or silicon oxide, wherein the process comprises depositing a triazine-containing compound comprised of melamine, melam, melem, melon or mixtures thereof onto the vapour-deposited layer of aluminum, aluminum oxide or silicon oxide during a vapour-depositing step at a pressure below 1000 Pa while maintaining the substrate during the vapour-depositing step at a temperature between −15° C. and +125° C. to thereby form the layer on the vapour-deposited layer of aluminum, aluminum oxide or silicon oxide.

2. Process according to claim 1, wherein the temperature of the substrate during the vapour-depositing step is between 0° C. and +50° C.

3. Process according to claim 2, wherein the triazine-containing compound comprises melamine, and wherein the process comprises applying a further layer which comprises a thermoplastic compound via lamination.

4. Process according to claim 3, wherein the substrate comprises a biaxially oriented polypropylene film.

5. Process according to claim 3, wherein the substrate comprises polyethylene terephthalate (PET).

6. Process according to claim 2, wherein the triazine-containing compound comprises melam, and wherein the process comprises applying a further layer which comprises a thermoplastic compound via lamination.

7. Process according to claim 6, wherein the substrate comprises a biaxially oriented polypropylene film or polyethylene terephthalate (PET).

8. Process according to claim 1, wherein the vapour-depositing step is practiced at a pressure below $5\times10^{-3}$ Pa.

9. Process according to claim 1, wherein the triazine-containing compound comprises melamine.

10. Process according to claim 9, which comprises applying a further layer which comprises a thermoplastic compound via lamination.

11. Process according to claim 1, wherein the substrate is, prior to the vapour-depositing step, treated with plasma, corona, UV radiation, or electron beam.

12. Process according to claim 1, wherein the vapour-depositing step comprises depositing the triazine-containing compound as a first layer on the vapour-deposited layer of aluminum, aluminum oxide or silicon oxide, and wherein the process further comprises applying a second layer on top of the first layer.

13. Process according to claim 12, wherein the vapour-deposited first layer is an interlayer.

14. Process according to claim 12, wherein the second layer is applied via lamination.

15. Process according to claim 12, wherein the second layer comprises a thermoplastic compound.

16. Process according to claim 1, wherein the vapour-depositing step comprises guiding the substrate over a temperature-controlled coating drum.

17. Process according to claim 1, wherein the temperature of the substrate is the temperature at which the coating drum is controlled.

18. Composite material according to claim 1, wherein the substrate comprises a biaxially oriented polypropylene film.

19. Process according to claim 1, wherein the substrate comprises polyethylene terephthalate (PET).

20. Process for the preparation of a composite material comprised of a substrate and a layer on the substrate, wherein the substrate comprises a polymeric film and a vapour-deposited layer of aluminum or aluminum oxide or silicon oxide, wherein the process comprises:
    (i) guiding the film during a vapour-depositing step over a temperature-controlled drum so as to provide the substrate at a temperature at which the drum is controlled; and
    (ii) depositing a triazine-containing compound comprised of melamine, or melam, or a mixture thereof onto the vapour-deposited layer of aluminum, aluminum oxide or silicon oxide during the vapour-depositing step at a pressure below 1000 Pa while maintaining the substrate during the vapour-depositing step at a temperature between 0° C. and +50° C. to thereby form the layer on the vapour-deposited layer of aluminum, aluminum oxide or silicon oxide.

* * * * *